US006984164B2

(12) United States Patent
Kimura et al.

(10) Patent No.: US 6,984,164 B2
(45) Date of Patent: *Jan. 10, 2006

(54) POLISHING APPARATUS

(75) Inventors: Norio Kimura, Fujisawa (JP); Hideji Isobe, Chigasaki (JP); Kazuo Shimizu, Yokohama (JP); Hiroyuki Osawa, Kawasaki (JP)

(73) Assignee: Ebara Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/864,322

(22) Filed: Jun. 10, 2004

(65) Prior Publication Data

US 2004/0224613 A1 Nov. 11, 2004

Related U.S. Application Data

(60) Division of application No. 10/388,508, filed on Mar. 17, 2003, now Pat. No. 6,764,381, which is a continuation of application No. 09/760,823, filed on Jan. 17, 2001, now Pat. No. 6,558,229.

(30) Foreign Application Priority Data

Jan. 17, 2000 (JP) ............................. 2000-008393

(51) Int. Cl.
*B24B 49/10* (2006.01)

(52) U.S. Cl. ............................................... 451/8; 451/5

(58) Field of Classification Search ................. 451/5–8
See application file for complete search history.

(56) References Cited

U.S. PATENT DOCUMENTS 4,793,895 A 12/1988 Kaanta et al.
5,081,421 A 1/1992 Miller et al.
5,213,655 A 5/1993 Leach et al.
5,240,552 A 8/1993 Yu et al.
5,321,304 A 6/1994 Rostoker
5,433,651 A 7/1995 Lustig et al.
5,609,511 A 3/1997 Moriyama et al.
5,838,447 A 11/1998 Hiyama et al.
5,897,426 A 4/1999 Somekh
5,949,927 A 9/1999 Tang
5,964,643 A 10/1999 Birang et al.
5,969,521 A 10/1999 Kurita et al.
6,020,968 A 2/2000 Horie
6,074,275 A 6/2000 Yashiki et al.
6,132,289 A 10/2000 Labunsky et al.
6,159,073 A 12/2000 Wiswesser et al.
6,172,756 B1 1/2001 Chalmers et al.

(Continued)

FOREIGN PATENT DOCUMENTS

EP 0824995 A1 2/1998
WO 01/46684 6/2001

*Primary Examiner*—David B. Thomas
(74) *Attorney, Agent, or Firm*—Wenderoth, Lind & Ponack, L.L.P.

(57) ABSTRACT

A polishing apparatus is used for polishing a substrate such as a semiconductor wafer, and has a sensor capable of continuously detecting the thickness of an electrically conductive layer. The polishing apparatus includes a polishing table having a polishing surface, and a top ring for holding and pressing the substrate against the polishing surface to polish the surface of the substrate. A sensor such as an eddy-current sensor is disposed below the polishing surface of the polishing table for measuring the thickness of a conductive layer formed on the surface of the substrate.

6 Claims, 5 Drawing Sheets

U.S. PATENT DOCUMENTS

| | | | | |
|---|---|---|---|---|
| 6,190,234 | B1 | 2/2001 | Swedek et al. | |
| 6,204,922 | B1 | 3/2001 | Chalmers | |
| 6,213,845 | B1 | 4/2001 | Elledge | |
| 6,234,870 | B1 | 5/2001 | Uzoh et al. | |
| 6,247,998 | B1 | 6/2001 | Wiswesser et al. | |
| 6,248,000 | B1 | 6/2001 | Aiyer | |
| 6,254,459 | B1 | 7/2001 | Bajaj et al. | |
| 6,261,155 | B1 | 7/2001 | Jairath et al. | |
| 6,280,290 | B1 | 8/2001 | Birang et al. | |
| 6,433,541 | B1 | 8/2002 | Lehman et al. | |
| 6,764,381 | B2 * | 7/2004 | Kimura et al. | 451/8 |
| 2003/0148706 | A1 * | 8/2003 | Birang et al. | 451/6 |

* cited by examiner

F I G. 1
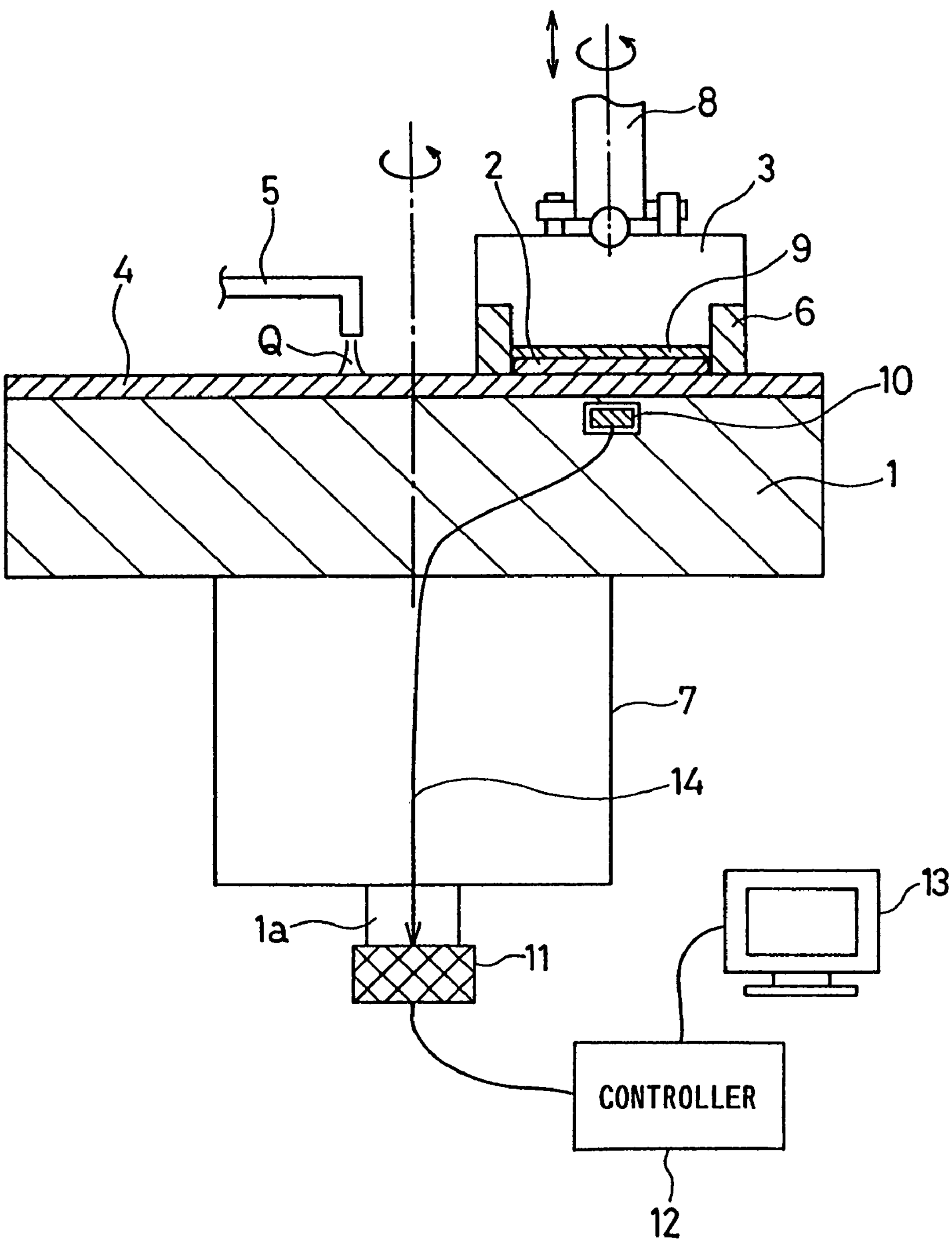

F I G. 2
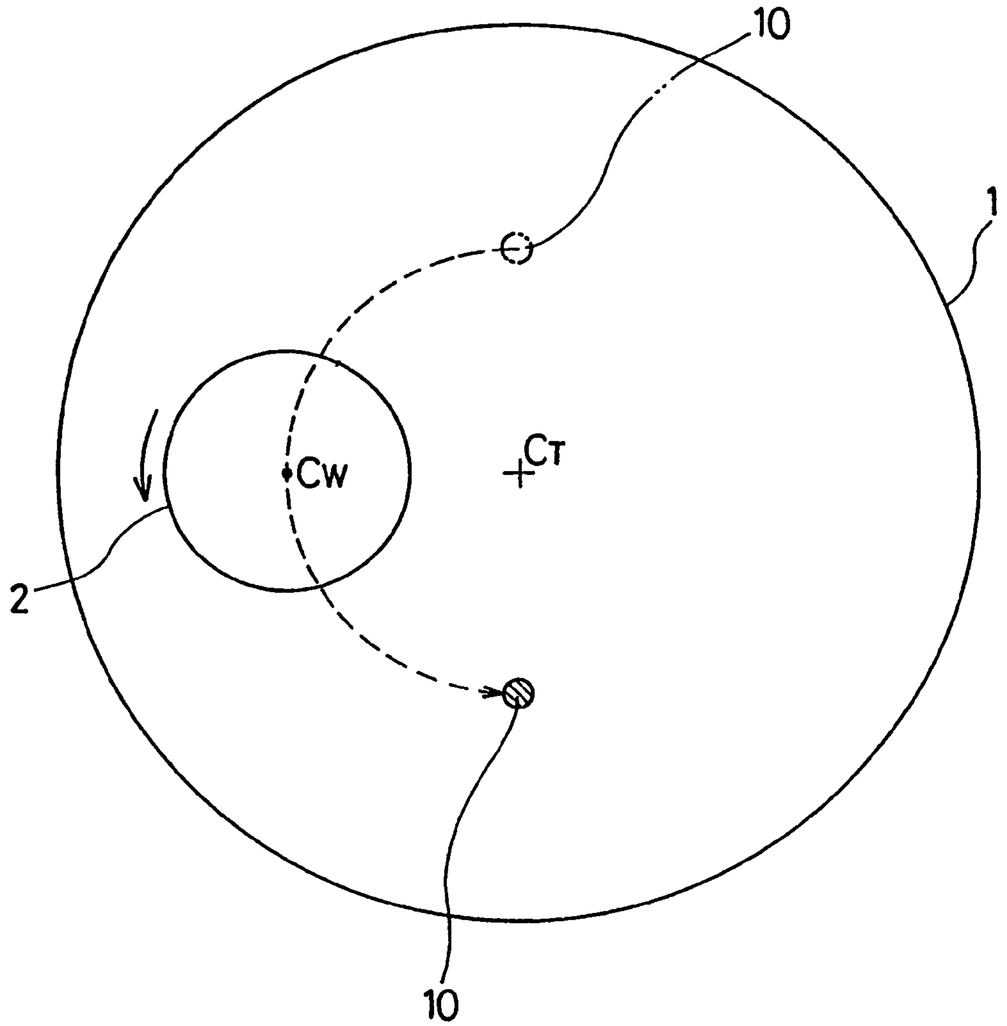
F I G. 3A
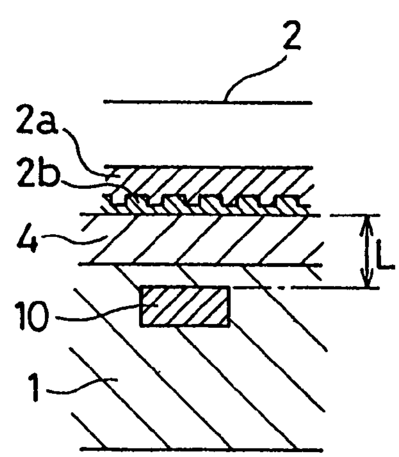
F I G. 3B
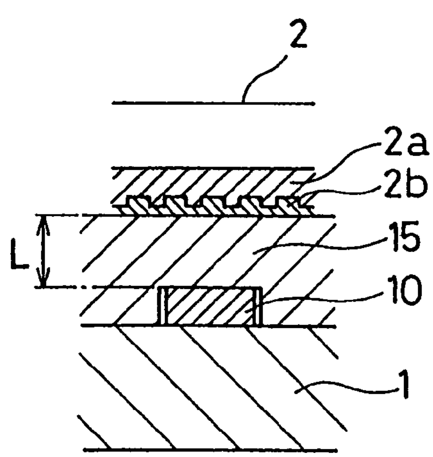

F I G. 4A
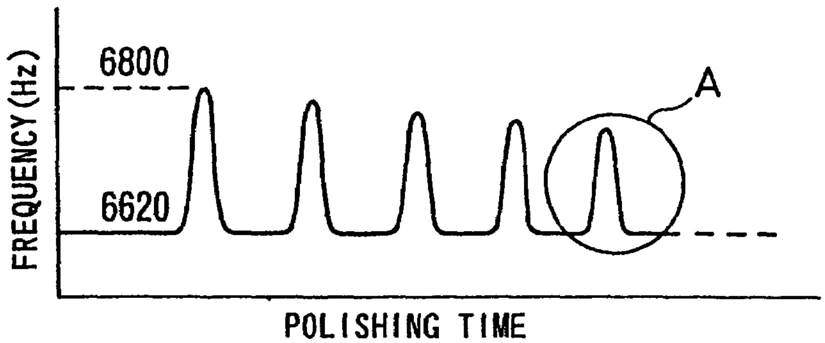
F I G. 4B
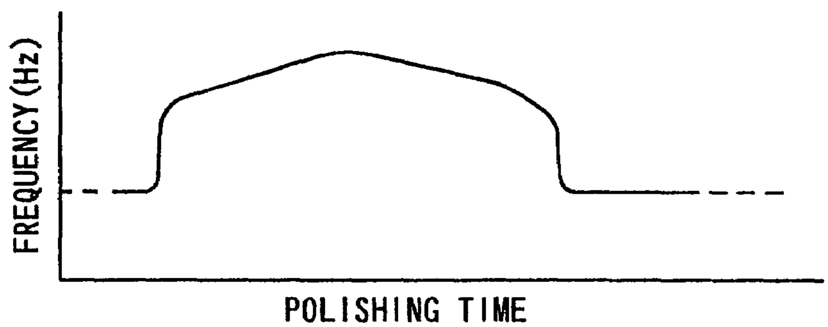
F I G. 5
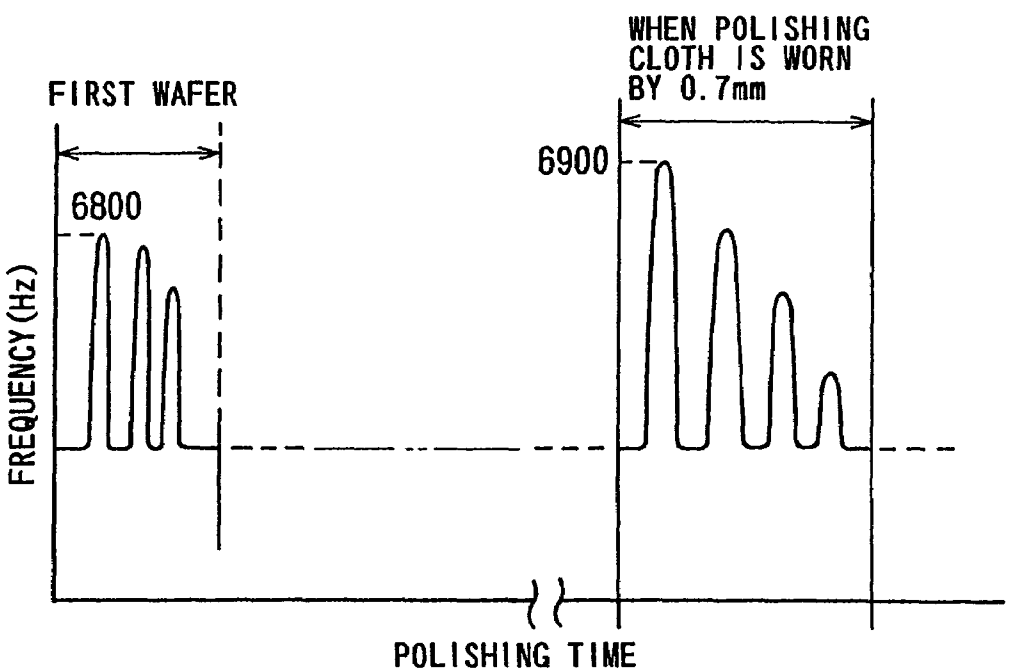

F I G. 7
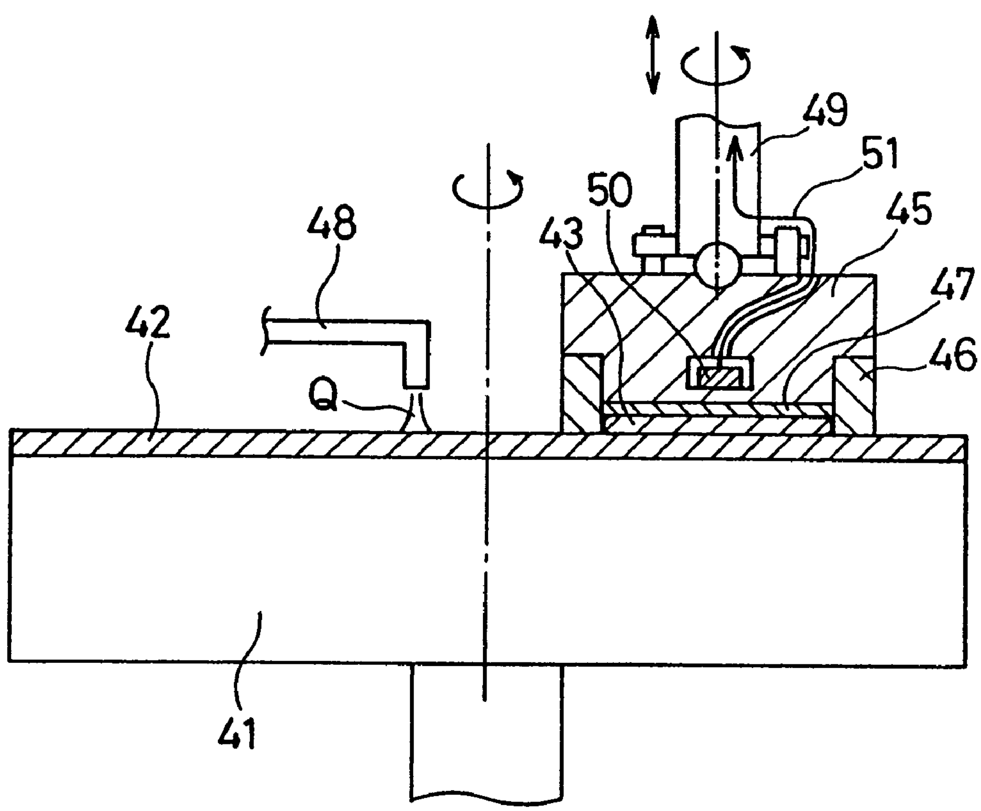

POLISHING APPARATUS

This is a Divisional application of U.S. patent application Ser. No. 10/388,508, filed Mar. 17, 2003, now U.S. Pat. No. 6,764,381, which in turn is a Continuation application of U.S. patent application Ser. No. 09/760,823, filed Jan. 17, 2001, now U.S. Pat. No. 6,558,229.

BACKGROUND OF THE INVENTION

1. Field of the Invention

The present invention relates to a polishing apparatus for polishing a substrate such as a semiconductor wafer, and more particularly to a polishing apparatus having a sensor capable of continuously detecting, on a real-time basis, the thickness of an electrically conductive film (layer) on a polished surface of the substrate while the polished surface of the substrate, mounted on a substrate holder such as a top ring, remains unexposed.

2. Description of the Related Art

Conventionally, in order to form a wiring circuit on a semiconductor substrate, a conductive film is deposited over a surface of a substrate by a sputtering process or the like, and then unnecessary portions are removed from the conductive film by a chemical dry etching process using a photoresist for a mask pattern.

Generally, aluminum or aluminum alloy has been used as a material for forming a wiring circuit. However, the higher integration of integrated circuits on the semiconductor substrate in recent years requires narrower wiring to increase the current density, resulting in generating thermal stress in the wiring and increasing the temperature of the wiring. This unfavorable condition becomes more significant as the wiring material, such as aluminum, becomes thinner, due to stress migration or electromigration, finally causing breaking of the wire or a short circuit.

Hence, in order to prevent the wiring from generating excess heat while current flows, a material such as copper, having a higher electrical conductivity, is required to be used for a wiring circuit. However, since copper or copper alloy is not suited for the dry etching process, it is difficult to adopt the above-mentioned method in which the wiring pattern is formed after depositing the conductive film over the whole surface of the substrate. Therefore, one of the possible processes is that grooves for a wiring circuit having a predetermined pattern are formed, and then the grooves are filled with copper or copper alloy. This process eliminates the etching process of removing unnecessary portions of the film, and needs only a polishing process for removing unevenness or irregularities of the surface. Further, this process offers advantages in that portions called wiring holes, connecting between an upper layer and a lower layer in a multilayer circuit, can be formed at the same time.

However, as the width of the wiring is narrower, such wiring grooves or wiring holes have a considerably higher aspect ratio (the ratio of depth to diameter or width), and hence it is difficult to fill the grooves or the holes with metal uniformly by the sputtering process. Further, although a chemical vapor deposition (CVD) process is used to deposit various materials, it is difficult to prepare an appropriate gas material for copper or copper alloy, and if an organic material is used for depositing copper or copper alloy, carbon (C) is mixed into the deposited film, increasing migration of the film.

Therefore, there has been proposed a method in which a substrate is dipped in a plating solution to plate the substrate with copper by an electrolytic plating or an electroless plating and then unnecessary portions of a copper layer is removed from the substrate by a chemical mechanical polishing (CMP) process. This formation of film or layer by the plating allows wiring grooves having a high aspect ratio to be uniformly filled with a metal having a high electrical conductivity. In the CMP process, a semiconductor wafer held by the top ring is pressed against a polishing cloth attached to a turntable, while supplying a polishing liquid containing abrasive particles, and thus the copper layer on the semiconductor substrate is polished.

When the copper layer is polished by the CMP process, it is necessary that the copper layer on the semiconductor substrate be selectively removed therefrom, while leaving only the copper layer in the grooves for a wiring circuit, i.e. interconnection grooves. More specifically, the copper layer on those surface areas of the semiconductor substrate other than the interconnection grooves needs to be removed until an oxide film of $SiO_2$ is exposed. If the copper layer in the interconnection grooves is excessively polished away together with the oxide film ($SiO_2$), then the resistance of the circuits on the semiconductor substrate would be so increased that the semiconductor substrate might possibly need to be discarded, resulting in a large loss. Conversely, if the semiconductor substrate is insufficiently polished to leave the copper layer on the oxide film, then the circuits on the semiconductor substrate would not be separated from each other, but short-circuited. As a consequence, the semiconductor substrate would be required to be polished again, and hence its manufacturing cost would be increased. This holds true for semiconductor substrates which have an electrically conductive layer of aluminum that needs to be selectively polished away by the CMP process.

Therefore, it has been proposed to detect an end point of the CMP process using an eddy-current sensor. Such end point detecting process in the CMP process will be described below with reference to FIG. 7 of the accompanying drawings. FIG. 7 shows a conventional polishing apparatus incorporating an eddy-current sensor as an end point detector. As shown in FIG. 7, the polishing apparatus comprises a turntable 41 with a polishing cloth 42 mounted on an upper surface thereof, and a top ring 45 for holding a semiconductor wafer 43 as a semiconductor substrate, and rotating and pressing the semiconductor wafer 43 against the polishing cloth 42. The polishing apparatus further comprises a polishing liquid supply nozzle 48 positioned above the turntable 41 for supplying a polishing liquid Q to the polishing cloth 42 on the turntable 41.

The top ring 45 is coupled to a top ring drive shaft 49, and has an elastic pad 47 of polyurethane or the like attached to its lower surface. The top ring 45 holds the semiconductor wafer 43 in contact with the elastic pad 47. A cylindrical retainer ring 46 is disposed around and fixed to an outer circumferential edge of the top ring 45 for preventing the semiconductor wafer 43 from being dislodged from the top ring 45 while the semiconductor wafer 43 is being polished.

The retainer ring 46 which is fixed to the top ring 45 has a lower end projecting downwardly from the holding surface of the top ring 45. The semiconductor wafer 43 is held on the holding surface of the top ring 45 by the retainer ring 46 against dislodgement from the top ring 45 under frictional forces produced by frictional engagement with the polishing cloth 42. The top ring 45 houses therein an eddy-current sensor 50 which is electrically connected to an external controller (not shown) by a wire 51 extending through the top ring 45 and the top ring drive shaft 49.

The polishing apparatus shown in FIG. 7 operates as follows: The semiconductor wafer 43 is held on the lower surface of the elastic pad 47 on the top ring 45, and pressed against the polishing cloth 42 on the turntable 41 by the top ring 45. The turntable 41 and the top ring 45 are rotated independently of each other to move the polishing cloth 42 and the semiconductor wafer 43 relative to each other to thereby polish the semiconductor wafer 43. At the same time, the polishing liquid supply nozzle 48 supplies a polishing liquid Q onto the polishing cloth 42. For polishing a copper layer, as a conductive layer, on the semiconductor wafer 43, the polishing liquid Q comprises an oxidizing agent with fine abrasive particles of alumina or silica suspended therein. The semiconductor wafer 43 is polished by a combination of a chemical reaction which oxidizes the surface of the copper layer with the oxidizing agent and a mechanical polishing action which mechanically polishes the surface of the copper layer with the fine abrasive particles.

While the semiconductor wafer is being polished, the eddy-current sensor 50 continuously detects a change in the thickness of the conductive layer, i.e. the copper layer on the semiconductor wafer 43. The external controller monitors an output signal from the eddy-current sensor 50, and detects an end point of the CMP process based on a change in the frequency of the output signal when the conductive layer on the oxide film ($SiO_2$) is removed, while leaving only the conductive layer in interconnection grooves of the semiconductor wafer 43.

However, one problem of the eddy-current sensor 50 shown in FIG. 7 is that the eddy-current sensor 50 is provided in the top ring 45, and hence only the thickness of the copper layer directly below the eddy-current sensor 50 can be detected. If a plurality of eddy-current sensors are provided in the top ring 45, then the thickness of the copper layer can be detected at a plurality of locations on the copper layer. However, the plural eddy-current sensors are only capable of obtaining discrete measured values from those separate locations, and fail to produce a continuous profile of measured values. Another drawback is that as the number of eddy-current sensors increases, the cost of the polishing apparatus increases, and the external controller is required to perform a complex signal processing sequence.

SUMMARY OF THE INVENTION

It is therefore an object of the present invention to provide a polishing apparatus which has a polishing table with a polishing cloth or a fixed abrasive plate, and a sensor such as an eddy-current sensor mounted at the polishing table for producing a real-time continuous measured value that represents the thickness of a conductive layer such as a copper layer or an aluminum layer on a semiconductor substrate during polishing.

According to the present invention, there is provided a polishing apparatus comprising a polishing table having a polishing surface, a top ring for holding a substrate and pressing a surface of the substrate against the polishing surface to polish the surface of the substrate, and at least one sensor disposed below the polishing surface of the polishing table for measuring the thickness of a conductive layer formed on the surface of the substrate.

The polishing table comprises a turntable which rotates about its own axis. The polishing surface may comprise a polishing cloth or a fixed abrasive plate. If the polishing surface comprises a polishing cloth, then the sensor is mounted in the polishing table. If the polishing surface comprises a fixed abrasive plate, then the sensor is mounted in the fixed abrasive plate.

The conductive layer is polished while the surface of the substrate is brought in sliding contact with the polishing surface. The sensor, which typically comprises an eddy-current sensor, passes directly below the surface of the substrate being polished each time the polishing table makes one revolution. Since the eddy-current sensor is positioned on an arcuate path passing through the center of the substrate, the eddy-current sensor is capable of continuously detecting the thickness of the conductive layer as the eddy-current sensor moves along the arcuate path beneath the substrate.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 1 is a vertical cross-sectional view of a polishing apparatus according to an embodiment of the present invention;

FIG. 2 is a plan view of a turntable of the polishing apparatus shown in FIG. 1;

FIG. 3A is a fragmentary vertical cross-sectional view showing an eddy-current sensor mounted in a turntable with a polishing cloth mounted thereon;

FIG. 3B is a fragmentary vertical cross-sectional view showing an eddy-current sensor mounted on a turntable with a fixed abrasive plate mounted thereon;

FIG. 4A is a graph showing changes in the resonance frequency of a detected signal that is produced by the eddy-current sensor and processed by a controller while a semiconductor wafer is being polished and as the eddy-current sensor passes directly below the semiconductor wafer a plurality of times;

FIG. 4B is a graph showing, at an enlarged scale, an encircled portion A in FIG. 4A;

FIG. 5 is a graph showing changes in the resonance frequency of a detected signal that is produced by the eddy-current sensor and processed by the controller when a plurality of semiconductor wafers are polished by a single polishing cloth;

FIG. 7 is a vertical cross-sectional view of a conventional polishing apparatus.

DETAILED DESCRIPTION OF THE PREFERRED EMBODIMENTS

Figure 6A:
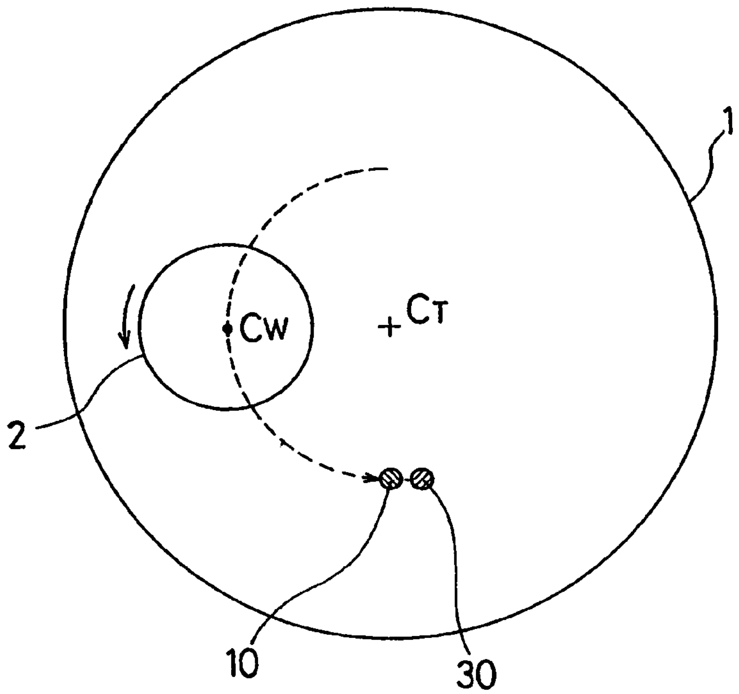
FIG. 6A is a plan view of a turntable of a polishing apparatus according to another embodiment of the present invention.

A polishing apparatus according to an embodiment of the present invention will be described below with reference to FIGS. 1 through 5.

As shown in FIG. 1, a polishing apparatus has a turntable 1 constituting a polishing table, and a top ring 3 for holding a semiconductor wafer 2 and pressing the semiconductor wafer 2 against the turntable 1. The turntable 1 is coupled to a motor 7, and is rotatable about its own axis, as indicated by the arrow. A polishing cloth 4 is mounted on an upper surface of the turntable 1.

The top ring 3 is coupled to a motor (not shown) and connected to a lifting/lowering cylinder (not shown). Therefore, the top ring 3 is vertically movable and rotatable about its own axis, as indicated by the arrows, and can press the semiconductor wafer 2 against the polishing cloth 4 under a desired pressure. The top ring 3 is connected to the lower end of a vertical top ring drive shaft 8, and supports on its lower surface an elastic pad 9 of polyurethane or the like. A cylindrical retainer ring 6 is provided around an outer circumferential edge of the top ring 3 for preventing the semiconductor wafer 2 from being dislodged from the top ring 3 while the semiconductor wafer 2 is being polished.

A polishing liquid supply nozzle 5 is disposed above the turntable 1 for supplying a polishing liquid Q to the polishing cloth 4 on the turntable 1.

The turntable 1 houses therein an eddy-current sensor 10 which is electrically connected to a controller 12 by a wire 14 extending through the turntable 1, a turntable support shaft 1*a*, and a rotary connector or slip ring 11 mounted on a lower end of the turntable support shaft 1*a*. The controller 12 is connected to a display unit 13.

FIG. 2 shows the turntable 1 in plan. As shown in FIG. 2, the eddy-current sensor 10 is positioned so as to pass through the center $C_W$ of the semiconductor wafer 2 held by the top ring 3 when the turntable 1 rotates about its own axis $C_T$ while the semiconductor wafer 2 is being polished. While the eddy-current sensor 10 passes along an arcuate path beneath the semiconductor wafer 2, the eddy-current sensor 10 continuously detects the thickness of a conductive layer such as a copper layer on the semiconductor wafer 2.

FIGS. 3A and 3B show the eddy-current sensor 10 which is mounted in the turntable 1. FIG. 3A shows the eddy-current sensor 10 mounted in the turntable 1 with the polishing cloth 4 attached thereto, and FIG. 3B shows the eddy-current sensor 10 mounted on the turntable 1 with a fixed abrasive plate 15 attached thereto. If the polishing cloth 4 is mounted on the turntable 1 as shown in FIG. 3A, then the eddy-current sensor 10 is mounted in the turntable 1. If the fixed abrasive plate 15 is mounted on the turntable 1 as shown in FIG. 3B, then the eddy-current sensor 10 is mounted on the turntable 1 and provided in the fixed abrasive plate 15.

In each of the structures shown in FIGS. 3A and 3B, the upper surface, i.e. the polishing surface of the polishing cloth 4 or the fixed abrasive plate 15 (corresponding to the polished surface of the semiconductor wafer 2) may be spaced from the upper surface of the eddy-current sensor 10 by a distance L of 1.3 mm or more. As shown in FIGS. 3A and 3B, the semiconductor wafer 2 comprises an oxide film 2*a* of $SiO_2$, and a conductive layer 2*b* of copper or aluminum provided on the oxide film 2*a*.

The polishing cloth 4 comprises a nonwoven fabric such as Politex, manufactured by Rodel Products Corporation, or polyurethane foam such as IC1000. The fixed abrasive plate 15 comprises a disk of fine abrasive particles of, for example, $CeO_2$ having a particle size of several μm or less and bonded together by a binder of synthetic resin.

The polishing apparatus shown in FIG. 2 operates as follows: The semiconductor wafer 2 is held on the lower surface of the top ring 3, and pressed by the lifting/lowering cylinder against the polishing cloth 4 on the turntable 1 which is rotating. The polishing liquid supply nozzle 5 supplies the polishing liquid Q to the polishing cloth 4 on the turntable 1, and the supplied polishing liquid Q is retained on the polishing cloth 4. The semiconductor wafer 2 is polished in the presence of the polishing liquid Q between the lower surface of the semiconductor wafer 2 and the polishing cloth 4. While the semiconductor wafer 2 is being thus polished, the eddy-current sensor 10 passes directly beneath the surface, being polished, of the semiconductor wafer 2 each time the turntable 1 makes one revolution. Since the eddy-current sensor 10 is positioned on an arcuate path extending through the center $C_W$ of the semiconductor wafer 2, the eddy-current sensor 10 is capable of continuously detecting the thickness of the conductive layer 2*b* on the semiconductor wafer 2 as the eddy-current sensor 10 moves along the arcuate path beneath the semiconductor wafer 2. In order to shorten the interval between detecting intervals, one or more eddy-current sensors 10 may be added as indicated by the imaginary lines in FIG. 2, so that at least two sensors are provided in the turntable 1.

The principles of detecting the thickness of the conductive layer of copper or aluminum on the semiconductor wafer with the eddy-current sensor will be described below.

The eddy-current sensor has a coil which is supplied with a high-frequency current. When the high-frequency current is supplied to the coil of the eddy-current sensor, an eddy current is generated in the conductive layer on the semiconductor wafer. Since the generated eddy current varies depending on the thickness of the conductive layer, the combined impedance of the eddy-current sensor and the conductive layer is monitored to detect an end point of the CMP process. Specifically, the combined impedance Z of the eddy-current sensor and the conductive layer is represented by the inductive and capacitive elements L, C of the eddy-current sensor, and the resistive element R of the conductive layer which is connected parallel to the inductive and capacitive elements L, C. When the resistive element R in the equation shown below varies, the combined impedance Z also varies. At this time, the resonance frequency also varies, and a rate of change of the resonance frequency is monitored to determine an end point of the CMP process.

$$Z = \frac{j\omega L}{(1-\omega^2 LC) + \frac{j\omega L}{R}}$$

where Z: combined impedance, j: square root of −1 (imaginary number), L: inductance, f: resonance frequency, C: electrostatic capacitance, R: resistance of the conductive layer, $\omega=2\pi f$.

FIGS. 4A and 4B are graphs showing changes in the resonance frequency of a detected signal that is produced by the eddy-current sensor 10 and processed by the controller 12 while the semiconductor wafer 2 is being polished. In FIGS. 4A and 4B, the horizontal axis represents polishing time, and the vertical axis represents the resonance frequency (Hz). FIG. 4A shows changes in the resonance frequency when the eddy-current sensor 10 passes a plurality of times directly below the semiconductor wafer 2, and FIG. 4B shows, at an enlarged scale, an encircled portion A in FIG. 4A. The result shown in FIGS. 4A and 4B is obtained when the conductive layer on the semiconductor wafer 2 is a copper film.

As shown in FIG. 4A, as the polishing of the semiconductor wafer 2 progresses, the value produced by processing the detected signal from the eddy-current sensor 10 is progressively reduced. This processing of the detected signal is performed by the controller 12. Specifically, as the thickness of the conductive layer decreases, the resonance frequency obtained by processing the detected signal from the eddy-current sensor 10 is progressively reduced. In FIG. 4A, the resonance frequency decreases from an initial value of 6800 Hz. Therefore, if the value of the resonance frequency, at the time when the conductive layer is removed except for the conductive layer in the interconnection grooves, has been examined, then an end point of the CMP process can be detected by monitoring the value of the resonance frequency. In FIG. 4A, the value of the resonance frequency at the time when the conductive layer is removed except for the conductive layer in the interconnection grooves is 6620 Hz. If a certain frequency before reaching the end point of the CMP process is established as a threshold, then it is possible to polish the semiconductor wafer 2 with the fixed abrasive plate 15 (see FIG. 3B) at a higher polishing rate, then polish the semiconductor wafer 2 with the polishing cloth 4 (see FIG. 3A) at a lower polishing rate after the threshold is reached, and finish the CMP process when the end point thereof is reached.

Further, the eddy-current sensor has different sensitivity for measuring the thickness of the conductive layer depending on the frequency of the high-frequency current supplied to the sensor coil. For example, when the high-frequency current having a frequency of 20 MHz is supplied to the sensor coil, the eddy-current sensor can measure the thickness of the conductive layer over a wide range of thicknesses from 0 to 10000 Å, and when the high-frequency current having a frequency of 160 MHz is supplied to the sensor coil, the eddy-current sensor is sensitive to the thickness of the conductive layer in a relatively narrow range of thickness from 0 to 1000 Å. Therefore, it is possible to measure the thickness of the conductive layer precisely and increase the efficiency of the process by selecting the frequency of the high-frequency current supplied to the eddy-current sensor depending on the polishing process (the thickness of the layer to be measured or the kind of the layer) or combining a plurality of eddy-current sensors. Alternatively, the eddy-current sensor may be changed depending on the polishing process.

As shown in FIG. 4B, when the eddy-current sensor 10 passes directly below the semiconductor wafer 2, a change in the resonance frequency within the polished surface of the semiconductor wafer 2 can be detected. Specifically, since a change in the resonance frequency corresponds to a change in the thickness of the conductive layer and the eddy-current sensor 10 is positioned so as to pass through the center $C_W$ of the semiconductor wafer 2, the polishing uniformity of the semiconductor wafer 2 in a substantially diametrical direction thereof can be detected by monitoring the detected signal from the eddy-current sensor 10. If the detected polishing uniformity within the polished surface of the semiconductor wafer 2 is supplied to the controller, then polishing conditions including the pressing force applied to the top ring 3 to press the semiconductor layer 2 and the distribution of pressures applied to the upper surface of the semiconductor wafer 2 can be changed to improve the polishing uniformity within the polished surface of the semiconductor wafer 2.

FIG. 5 is a graph showing changes in the resonance frequency of a detected signal that is produced by the eddy-current sensor 10 and processed by the controller 12 while a plurality of semiconductor wafers are being polished by a single polishing cloth. In FIG. 5, the horizontal axis represents polishing time, and the vertical axis represents the resonance frequency (Hz). The polishing cloth is worn by a thickness of 0.7 mm after the polishing cloth has polished a plurality of semiconductor wafers and has been dressed a plurality of times.

As shown in FIG. 5, the resonance frequency obtained by processing the detected signal from the eddy-current sensor 10 each time a polishing cycle starts is higher when the polishing cloth has been repeatedly used than when the polishing cloth is used for the first time. Specifically, the resonance frequency increases from 6800 Hz when the polishing cloth is used for the first time to 6900 Hz when the polishing cloth has been repeatedly used. Since the rate of abrasion of the polishing cloth can be determined by monitoring the resonance frequency each time a polishing cycle starts, the timing to replace the polishing cloth can accurately be determined.

Figure 6B:
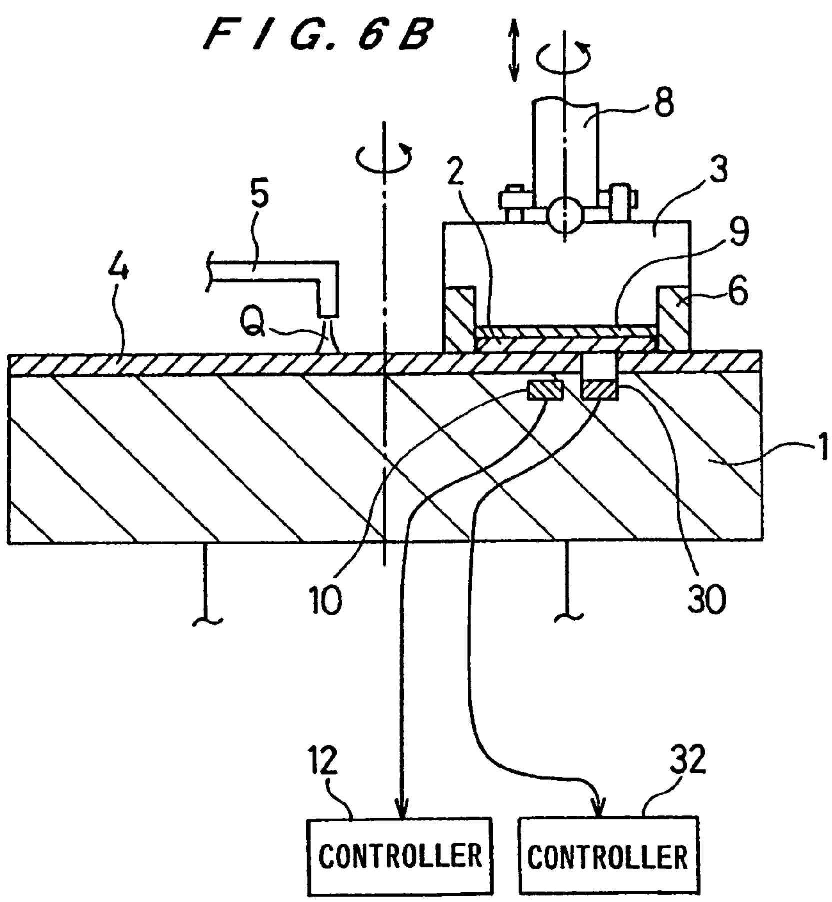
FIG. 6B is a vertical cross-sectional view of the polishing apparatus according to the embodiment shown in FIG. 6A.

FIGS. 6A and 6B show a polishing apparatus according to another embodiment of the present invention. FIG. 6A is a plan view of a turntable in the polishing apparatus, and FIG. 6B is a vertical cross-sectional view of the polishing apparatus.

The polishing apparatus shown in FIGS. 6A and 6B is different from the polishing apparatus shown in FIGS. 1 and 2 in that an optical sensor 30 is mounted in the turntable 1 adjacent to the eddy-current sensor 10 and connected to a controller 32. The optical sensor 30 comprises a light-emitting element and a light-detecting element. The light-emitting element applies light to the surface, being polished, of the semiconductor wafer 2, and the light-detecting element detects reflected light from the surface, being polished, of the semiconductor wafer 2. The light-emitting element comprises a laser beam source or an LED. When the thickness of the conductive layer of copper, aluminum or the like is reduced to a certain smaller value, a portion of the light applied from the light-emitting element to the surface of the semiconductor wafer 2 being polished passes through the conductive layer and is reflected from the surface of the oxide film under the conductive layer. Therefore, the light-detecting element detects both the light reflected by the conductive layer and the light reflected by the oxide film. A detected signal from the light-detecting element is processed by the controller 32 to detect the thickness of the conductive layer remaining on the oxide film more accurately than the eddy-current sensor 10.

Until the thickness of the conductive layer is reduced to a certain smaller value, the thickness of the conductive layer is monitored by the controller 12 which processes the signal from the eddy-current sensor 10. When the thickness of the conductive layer reaches the certain smaller value and begins to be detected by the optional sensor 30, the thickness of the conductive layer is monitored by the controller 32 which processes the signal from the optical sensor 30. Therefore, by using the optical sensor 30, which is of a higher sensitivity to the thickness of the conductive layer (film), it is possible to accurately detect the time when the conductive layer is removed, except for the conductive layer in the interconnection grooves, thereby determining an end point of the CMP process.

Alternatively, both the eddy-current sensor 10 and the optical sensor 30 can be used until an end point of the CMP process is reached. Specifically, the controllers 12 and 32 process the respective signals from the eddy-current sensor 10 and the optical sensor 30 to detect the time when the conductive layer is removed, except for the conductive layer in the interconnection grooves, thereby determining an end of the CMP process.

In the above embodiments, the conductive layer is made of copper or aluminum. However, the conductive layer may be made of chromium, tungsten, titanium, or the like.

According to the present invention, since a sensor such as an eddy-current sensor or an optical sensor or both is mounted in a polishing table which supports a polishing cloth or a fixed abrasive plate thereon, it is possible to obtain a real-time continuous measured value that represents the thickness of a conductive layer made of copper, aluminum, or the like on a surface of a semiconductor substrate which is being polished by the polishing apparatus.

Although certain preferred embodiments of the present invention have been shown and described in detail, it should be understood that various changes and modifications may be made therein without departing from the scope of the appended claims.

What is claimed is:

1. A polishing apparatus comprising:

a polishing table having a polishing surface;

a top ring for holding a substrate and pressing a surface of the substrate against said polishing surface to polish the surface of the substrate; and an eddy-current sensor for measuring the thickness of a conductive layer formed on the surface of the substrate to produce a detected signal indicating a polishing uniformity of the surface of the substrate in a substantially diametrical direction of the substrate as said eddy-current sensor passes beneath the surface of the substrate along an arc.

2. The polishing apparatus as recited in claim 1, further comprising a controller operable to process the detected signal from said eddy-current sensor.

3. The polishing apparatus as recited in claim 2, wherein said controller is operable to change a polishing condition of said polishing apparatus.

4. The polishing apparatus as recited in claim 3, wherein said controller is operable to change a distribution of pressures applied to the surface of the substrate.

5. The polishing apparatus as recited in claim 3, wherein said controller is operable to change a pressing force applied to said top ring to press the substrate.

6. The polishing apparatus as recited in claim 1, wherein said arc includes the center of the substrate.

* * * * *